United States Patent
Maydan et al.

(10) Patent No.: US 6,503,375 B1
(45) Date of Patent: Jan. 7, 2003

(54) ELECTROPLATING APPARATUS USING A PERFORATED PHOSPHORUS DOPED CONSUMABLE ANODE

(75) Inventors: Dan Maydan, Los Altos Hills, CA (US); Ashok K. Sinha, Palo Alto, CA (US)

(73) Assignee: Applied Materials, Inc, Santa Clara, CA (US)

( * ) Notice: Subject to any disclaimer, the term of this patent is extended or adjusted under 35 U.S.C. 154(b) by 0 days.

(21) Appl. No.: 09/503,156

(22) Filed: Feb. 11, 2000

(51) Int. Cl.[7] .............................. C25B 9/00; C25C 7/00; C25D 17/00
(52) U.S. Cl. ...................... 204/242; 204/275.1; 204/284
(58) Field of Search ............................. 204/275.1, 242, 204/284; 205/123, 125, 292

(56) References Cited

U.S. PATENT DOCUMENTS

| | | | | |
|---|---|---|---|---|
| 4,466,864 A | * | 8/1984 | Bacon et al. | 205/105 |
| 4,786,375 A | * | 11/1988 | Graydon et al. | 205/109 |
| 5,545,429 A | * | 8/1996 | Booth et al. | 427/97 |
| 5,893,966 A | | 4/1999 | Akram et al. | 205/137 |
| 5,969,422 A | | 10/1999 | Ting et al. | 257/762 |
| 5,976,341 A | * | 11/1999 | Schumacher et al. | 205/101 |
| 6,113,759 A | * | 9/2000 | Uzoh | 205/157 |
| 6,129,830 A | * | 10/2000 | Senge et al. | 205/104 |

FOREIGN PATENT DOCUMENTS

| | | | | |
|---|---|---|---|---|
| EP | 0 254 587 | 1/1988 | | C25C/1/24 |
| EP | 0 954 016 | 11/1999 | | H01L/21/285 |
| EP | 0 954 027 | 11/1999 | | H01L/23/532 |
| JP | 57-094600 | 6/1982 | | C25D/21/14 |

OTHER PUBLICATIONS

Australian Search Report from SG 200100762–4, Dated Feb. 18, 2002.

* cited by examiner

Primary Examiner—Nam Nguyen
Assistant Examiner—Wesley A. Nicolas
(74) Attorney, Agent, or Firm—Moser, Patterson & Sheridan

(57) ABSTRACT

The present invention generally provides an apparatus for forming a doped metal film on a conductive substrate. In one aspect of the invention, an apparatus is provided that includes a phosphorus doped anode used for depositing a phosphorus doped metal film, such as a seed layer, in an electrochemical deposition process. The phosphorus doped anode preferably includes an enclosure providing for flow of an electrolyte therethrough, a phosphorus doped metal disposed within the enclosure, and an electrode disposed through the enclosure and in electrical connection with the phosphorus doped metal. Another aspect of the invention provides an apparatus for electrochemical deposition of a phosphorus doped metal onto a substrate includes a substrate holder adapted to hold the substrate in a position where the substrate plating surface is exposed to an electrolyte in an electrolyte container, a cathode electrically contacting the substrate plating surface, an electrolyte container having an electrolyte inlet, an electrolyte outlet and an opening adapted to receive the substrate plating surface, and a phosphorus doped anode electrically connected to the electrolyte.

7 Claims, 4 Drawing Sheets

ELECTROPLATING APPARATUS USING A PERFORATED PHOSPHORUS DOPED CONSUMABLE ANODE

BACKGROUND OF THE INVENTION

1. Field of the Invention

The present invention generally relates to an apparatus and process for deposition of a metal layer onto a substrate. More particularly, the present invention relates to a process for forming a doped metal layer on a conductive substrate by an electroplating process.

2. Background of the Related Art

Reliably producing sub-half micron and smaller features is one of the key technologies for the next generation of very large scale integration (VLSI) and ultra large scale integration (ULSI) integrated circuits. However, as the fringes of circuit technology are pressed, the shrinking dimensions of interconnects in VLSI and ULSI technology has placed additional demands on the processing capabilities. The multilevel interconnects that lie at the heart of this technology require careful processing of high aspect ratio features, such as vias and other interconnects. Reliable formation of these interconnects is very important to the VLSI and ULSI success and to the continued effort to increase circuit density and quality of individual substrates and die.

As circuit densities increase, the widths of vias, contacts and other features, as well as the dielectric materials between them, decrease to sub-micron dimensions, whereas the thickness of the dielectric layers remains substantially constant, with the result that the aspect ratios for the features, i.e., their height divided by width, increases. Many traditional deposition processes have difficulty filling sub-micron structures where the aspect ratio exceeds 2:1, and particularly where it exceeds 4:1. Therefore, there is a great amount of ongoing effort being directed at the formation of substantially void-free, sub-micron features having high aspect ratios.

Elemental aluminum (Al) and its alloys have been the traditional metals used to form substrate features. Such as lines, contacts, interconnects, and plugs in semiconductor processing because of aluminum's perceived low electrical resistivity, aluminum's superior adhesion to silicon dioxide ($SiO_2$), the ease of patterning aluminum, and the ability to obtain aluminum in a highly pure form. However, aluminum has a higher electrical resistivity than other more conductive metals such as copper, and aluminum also can suffer from electromigration leading to the formation of voids in the conductor.

Copper and its alloys have lower resistivities than aluminum (1.7 $\Omega$-cm compared to 3.1 $\Omega$-cm for aluminum), with a higher current carrying capacity and significantly higher electromigration resistance as compared to aluminum. These characteristics are important for supporting the higher current densities experienced at high levels of integration and increase device speed. Copper also has good thermal conductivity and is available in a highly pure state. Therefore, copper is becoming the preferred metal for filling sub-quarter micron, high aspect ratio interconnect features on semiconductor substrates.

Despite the desirability of using copper for semiconductor device fabrication, choices of methods for depositing copper into features having high aspect ratios, such as a 10:1 aspect ratio, 0.25 $\mu$m wide vias, are limited. In the past, chemical vapor deposition (CVD) and physical vapor deposition (PVD) were the preferred processes for depositing electrically conductive material into the contacts, vias, lines, or other features formed on the substrate. However, for copper applications, CVD copper processes require copper containing precursors which have less than desirable deposition results and are still being developed, and PVD copper processes have faced many difficulties for depositing films in very small features. As a result of the obstacles faced in PVD and CVD copper deposition, electroplating, which had previously been limited to the circuit board fabrication, is being used to fill high aspect ratio features of substrates.

However, even electroplating has its own challenges for IC manufacturing processes. Certain electroplating deposition processes involve conformally depositing a thin electrically conductive seed layer, such as a copper layer, on a conductive substrate. In depositing the thin seed layer on the conductive substrate, the electroplated deposition process for certain conductive materials, such as copper, does not typically plate the seed layer evenly across the substrate surface. It is contemplated that one reason for this is that the high surface diffusivity of copper causes the uneven deposited copper material to agglomerate. The uneven deposition and agglomeration of the copper material is detrimental to circuit uniformity, conductivity, and reliability. Furthermore, the unevenness and agglomeration of the layer also reduces the effective adhesion of the copper material to the substrate and reduces the ability of subsequent layers to adequately bond to the copper material. Film agglomeration may also lead to improper filling of voids by "bridging" over substrate feature openings, thereby resulting in void formation and other discontinuities within the substrate features. Void formations in substrate features may detrimentally affect the performance of a semi-conductor device, and may even lead to device failure. Furthermore, if the electroplated seed layer is unevenly deposited on the substrate, then the current will not be evenly distributed over the surface of the seed layer and may result in non-uniform deposition of subsequent electrochemical deposited layers on the substrate.

Additionally, it has been discovered that some materials used in electroplating are prone to have unwanted side reactions during or after the deposition process. For example, copper, a frequently used seed layer material, is highly susceptible to oxidation. The oxidation of a metal layer may interfere with the adhesion of metal layers to adjacent layers, can detrimentally affect the conductivity of the metal feature, and may reduce the reliability of the overall circuit. Further, in some electroplating processes, a electroplating cell may contain a consumable anode of the same material as the deposited film, i.e., a copper anode for a copper film, and therefore, the anode may also be subjected to oxidation and form an oxide film on the surface of the anode. This oxide film can lead to less than desirable electroplating cell performance; and in the case of copper, excessive dissolution of the copper anode which may produce contaminants or particulate matter that may then be deposited on the substrate. Additionally, additives to the electroplating solution, such as those that provide for increased deposition or impart desired properties to a deposited substrate layer, may also be oxidized, thereby minimizing the additives effectiveness and potentially producing contaminants in the electroplating solutions.

Furthermore, in some processes, oxygen is a byproduct of the electrochemical deposition process and therefore cannot be easily minimized by agents external to the process. Thus, even carefully controlled environments may contain oxygen that may oxidize copper or other conductive materials, such as aluminum, to the detriment of the circuit and electroplating cell. Further, for some substrate feature forming processes, the substrate may be transferred between processing systems exposing the substrate to contaminants which may induce oxidation of the copper layers on the substrate following electroplating deposition.

Therefore, there is a need for an improved deposition process and apparatus that overcomes one or more of the difficulties in electroplating substrates. As discussed below, preferred embodiments of the invention reduce film agglomeration, reduce the formation of voids in features produced from electrochemical processes and/or reduce unwanted oxidation of metal films during and/or following deposition of the metal films on the features of a substrate. Preferably, the process and apparatus of the invention would provide for a more even deposition on a substrate surface and improve interlayer adhesion of deposited metal layers. Preferably, the apparatus would further reduce the unwanted oxidation and excessive dissolution of metal anodes used in electrochemical deposition processes.

SUMMARY OF THE INVENTION

The invention generally provides a method and an apparatus for forming a doped metal film on a conductive substrate. In one embodiment of the invention, the deposition process comprises first depositing a phosphorus containing layer on a conductive substrate, and then depositing a conductive metal layer on the phosphorus containing layer to form a conductive film. The phosphorus containing layer is preferably a phosphorus doped seed layer, which preferably includes a phosphorous compound, e.g., elemental phosphorus, and a conductive metal, preferably copper, with the phosphorus concentration in the seed layer preferably between about 0.01% and about 15% by weight, and the conductive metal layer preferably comprising copper. The phosphorus doped layer and the conductive metal layer are preferably deposited by an electro-chemical deposition process such as electroplating.

In another embodiment, the invention provides a method of processing a substrate including depositing a dielectric layer on a substrate, etching a feature into the substrate, depositing a conductive layer in the feature, depositing a phosphorus containing layer, preferably a phosphorus doped seed layer, on the conductive layer, and depositing a conductive metal layer on the phosphorus containing seed layer. The conductive layer is preferably a barrier or liner layer that includes a conductive metal selected from the group of titanium (Ti), titanium nitride (TiN), tantalum (Ta), tantalum nitride (TaN$_x$), tungsten (W), tungsten nitride (WN$_x$), and combinations thereof. The phosphorus doped seed layer preferably includes copper with the phosphorus concentration in the film of between about 0.01% and about 15% by weight, with the conductive metal layer preferably comprising copper.

In another embodiment of the invention, an apparatus is provided that includes a doped anode, preferably a phosphorus doped anode, for depositing a phosphorus doped metal film, such as a seed layer, in an electrochemical deposition process. The phosphorus doped anode preferably includes an enclosure providing for flow of an electrolyte therethrough, a phosphorus doped metal disposed within the enclosure, and an electrode disposed through the enclosure and in electrical connection with the phosphorus doped metal. The phosphorus doped metal is preferably in the form of a consumable phosphorus doped anode plate having a plurality of longitudinal disposed passages formed therein, and preferably includes copper doped with phosphorus, with the phosphorus concentration in the phosphorus doped metal preferably being between about 0.01% and about 15% by weight.

Another embodiment of the invention provides an apparatus for electrochemical deposition of a phosphorus doped metal onto a substrate that includes a substrate holder adapted to hold the substrate in a position where the substrate plating surface is exposed to an electrolyte, a cathode electrically contacting the substrate plating surface, an electrolyte container having an electrolyte inlet, an electrolyte outlet and an opening adapted to receive the substrate plating surface, and a phosphorus doped anode electrically connected to the electrolyte. The phosphorus doped anode preferably includes an enclosure providing for flow of an electrolyte therethrough, a phosphorus doped metal disposed within the enclosure, and an electrode disposed through the enclosure and in electrical connection with the phosphorus doped metal. The phosphorus doped anode includes copper doped with phosphorus, with the phosphorus concentration in the phosphorus doped metal preferably being between about 0.01% and about 15% by weight of phosphorus.

BRIEF DESCRIPTION OF THE DRAWINGS

A more particular description of certain embodiments of the invention, briefly summarized above, may be had by reference to the appended drawings which illustrate the embodiments thereof.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
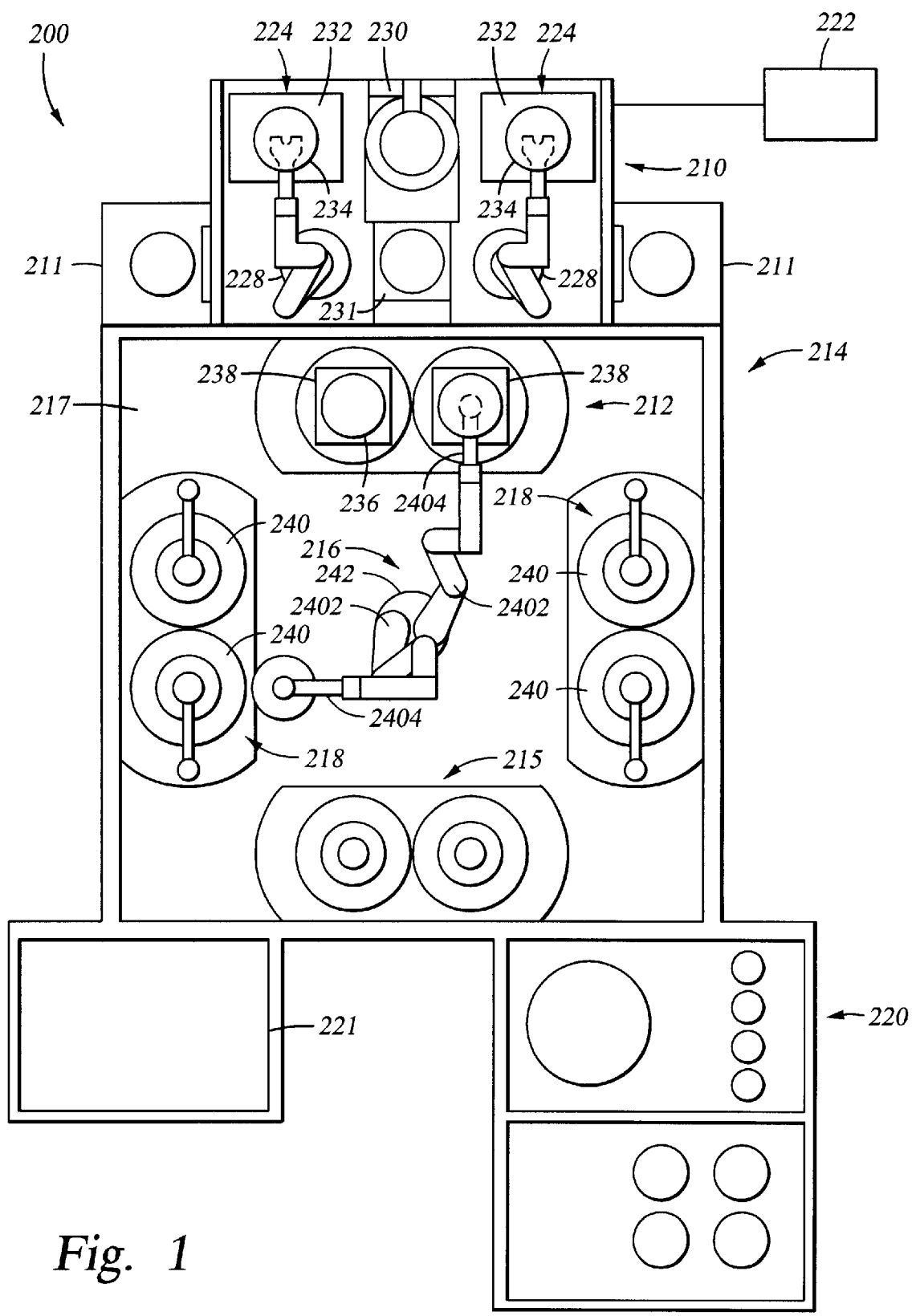
FIG. 1 is a perspective view of an electroplating system platform.

The invention generally relates to an apparatus and process for deposition of a doped conductive layer onto a conductive substrate. In a preferred embodiment of the invention, a deposition process is provided for forming a conductive metal film substantially free of layering defects such as film unevenness and film agglomeration. The preferred deposition process includes depositing a phosphorus doped seed layer, preferably by an electroplating technique, and then depositing a conductive metal layer on the phosphorus doped seed layer. The phosphorus doped seed layer includes phosphorus and a conductive metal, preferably copper, with the concentration of phosphorus in the seed layer preferably between about 0.01% and about 15% by weight. The conductive metal layer preferably includes the same conductive metal as in the phosphorus doped seed layer, for example copper for a phosphorus doped copper seed layer. The phosphorus doped seed layer and the conductive metal layer are both preferably deposited by electroplating at about room temperature. As used herein, the term "phosphorus" refers to any phosphorus containing compound, and is preferably elemental phosphorus. Further, as used herein, the terms "conductive" or "conducting" refer to the ability of a material to carry an electrical current sufficient for use in electrochemical deposition processes, such as electroplating. It is contemplated that the phosphorus doping of the seed layer provides for increased film evenness from increased current distribution, reduced film agglomeration, improved electromigration properties, better grain growth control of the seed layer and subsequently deposited films, minimization of the oxidation of deposited conductive metal films, and substantially void free fill of high aspect ratios.

The invention also provides a phosphorus doped anode and an apparatus for depositing phosphorus doped films in an electrochemical deposition process. The phosphorus doped anode preferably includes a phosphorus doped metal disposed in an enclosure through which an electrolyte flows, and an electrode disposed through the enclosure and in electrical connection with the phosphorus doped metal, where the doped metal is preferably in the form of a perforated plate. The phosphorus doped anode preferably includes copper doped with phosphorus between about 0.01% and about 15% by weight of the phosphorus doped anode. The anode may be further used in an electrochemical deposition apparatus, such as an electroplating cell, and includes a substrate holder for holding and positioning a substrate, a cathode in contact with the substrate, an electrolyte container that may receive the substrate and the phosphorus doped anode in contact with the electrolyte. It is contemplated that the phosphorus doped anode minimizes anode polarization and oxidative side reactions, including oxygen co-evolution, or bubble formation, as well as minimizes excess dissolution of the phosphorus doped anode material.

While the following description of the invention refers to the use of phosphorus in an anode, it is contemplated that other dopants, instead or in addition to phosphorus may also be used. These other dopants may also be deoxidants. Examples of other preferred dopants are boron, indium, tin, beryllium and combinations thereof. It is contemplated that these other dopants provide a similar functionality to phosphorus are also contemplated by and thus within the scope of the invention.

Accordingly, in another aspect, one embodiment of the invention is directed to forming a doped metal film on a conductive substrate. The doped metal film is formed by depositing a dopant containing layer on a conductive substrate, and then depositing a conductive metal layer on the dopant containing layer to form a doped metal film. Preferred dopants include boron, indium, tin, beryllium, and combinations thereof, which can improve deposition uniformity of the doped layer over the substrate surface and to reduce oxidation of the conductive material. The dopant containing layer is preferably a seed layer comprising one or more dopants, and a conductive metal, preferably copper, with the dopant concentration in the seed layer preferably between about 0.01% and about 15% by weight, and the conductive metal layer preferably comprising copper. The dopant metal film may also be used for processing a substrate by depositing a dielectric layer on a substrate, etching a feature into the substrate, depositing a conductive layer in the feature, depositing a phosphorus containing layer, preferably a phosphorus doped seed layer, on the conductive layer, and depositing a conductive metal layer on the phosphorus containing seed layer.

Additionally, in another aspect, one embodiment of the invention is directed to an apparatus for depositing doped metal films by a doped anode which may be further used in an electrochemical deposition apparatus. Preferred dopants for use with the anode include boron, indium, tin, beryllium, and combinations thereof. The doped anode preferably includes a doped metal disposed in an enclosure through which an electrolyte flows, and an electrode disposed through the enclosure and in electrical connection with the doped metal, where the doped metal is preferably in the form of a perforated plate. The doped anode preferably includes copper with a dopant concentration between about 0.01% and about 15% by weight.

Apparatus

Figure 2:
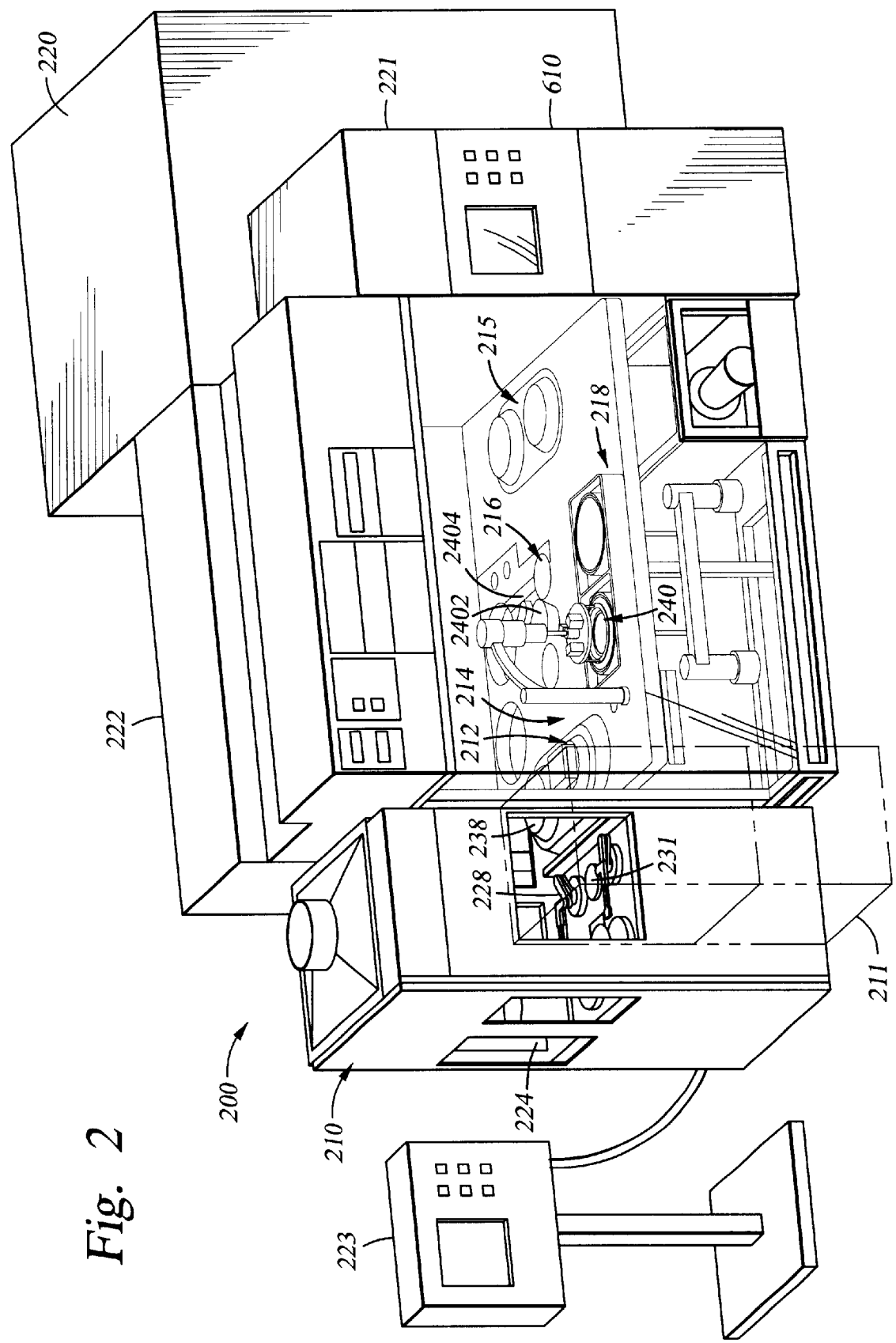
FIG. 2 is a schematic top view of an electroplating system platform.

FIG. 1 is a perspective view of an exemplary electroplating system platform 200 illustrating one embodiment of an apparatus which may be used to carry out a method that is an embodiment of the invention. FIG. 2 is a schematic top view of the electroplating system platform 200 shown in FIG. 1. The exemplary electroplating system platform 200 and alternative embodiments are more fully described in co-pending U.S. patent application Ser. No. 09/289,074, entitled "Electro-Chemical Deposition System", filed on Apr. 8, 1999, which is incorporated herein by reference to the extent not inconsistent with this invention. Another exemplary electroplating system which may be used to carry out a method that is an embodiment of the invention is described in pending U.S. patent application Ser. No. 09/350,877, filed on Jul. 9, 1999, which is incorporated herein by reference to the extent not inconsistent with this invention. As discussed above, one embodiment or example of an apparatus of the claimed invention is illustrated in FIGS. 1 and 2. It is understood, however, that the invention is by no means limited to the apparatus.

Referring to both FIGS. 1 and 2, the electroplating system platform 200 generally includes a loading station 210, a thermal anneal chamber 211, a mainframe 214, and an electrolyte replenishing system 220. The mainframe 214 generally includes a mainframe transfer station 216, a spin-rinse dry (SRD) station 212, a plurality of processing stations 218, and a seed layer enhancement station 215. Preferably, the electroplating system platform 200, including the mainframe 214, is enclosed in a clean environment using panels such as Plexiglas panels. The mainframe 214 includes a base 217 having cut-outs to support various stations used to complete the electrochemical deposition processes of the invention. The base 217 is preferably made of aluminum, stainless steel or other rigid materials that can support the various stations disposed thereon. A chemical protection coating, such as Halar™, ethylene-chloro-tri-fluoro-ethaylene (ECTFE), or other protective coatings, is preferably disposed over the surfaces of the base 217 that are exposed to potential chemical corrosion. Each processing station 218 includes one or more processing cells 240. An electrolyte replenishing system 220 is positioned adjacent the mainframe 214 and connected to the process cells 240 individually to circulate electrolyte used for the electroplating process. The electroplating system platform 200 also includes a power supply station 221 for providing electrical power to the system and a control system 222, typically including a programmable microprocessor.

The loading station 210 preferably includes one or more substrate cassette receiving areas 224, one or more loading station transfer robots 228 and at least one substrate orientor 230. A number of substrate cassette receiving areas, loading station transfer robots 228 and substrate orientor included in the loading station 210 can be configured according to the desired throughput of the system. As shown in FIGS. 1 and 2, the loading station 210 includes two substrate cassette receiving areas 224, two loading station transfer robots 228 and one substrate orientor 230. A substrate cassette 232 containing substrates 234 is loaded onto the substrate cassette receiving area 224 to introduce substrates 234 into the electroplating system platform. The loading station transfer robot 228 transfers substrates 234 between the substrate cassette 232 and the substrate orientor 230. The loading station transfer robot 228 includes a typical transfer robot commonly known in the art. The substrate orientor 230 positions each substrate 234 in a desired orientation to ensure that the substrate is properly processed. The loading station transfer robot 228 also transfers substrates 234 between the loading station 210 and the SRD station 212 and between the loading station 210 and the thermal anneal chamber 211. The loading station 210 preferably also includes a substrate cassette 231 for temporary storage of substrates as needed to facilitate efficient transfer of substrates through the system.

FIG. 2 also shows a mainframe transfer robot 242 having a flipper robot 2404 incorporated therein. The mainframe transfer robot 242 serves to transfer substrates between different stations attached to the mainframe station, including the processing stations and the SRD stations. The mainframe transfer robot 242 includes a plurality of robot arms 2402 (two shown), and a flipper robot 2404 is attached as an end effector for each of the robot arms 2402. Flipper robots are generally known in the art and can be attached as end effectors for substrate handling robots, such as model RR701, available from Rorze Automation, Inc., located in Milpitas, Calif. The main transfer robot 242 having a flipper robot as the end effector is capable of transferring substrates between different stations attached to the mainframe as well as flipping the substrate being transferred to the desired surface orientation. For example, the flipper robot flips the substrate processing surface face-down for the electroplating process in the processing cell 240 and flips the substrate processing surface face-up for other processes, such as the spin-rinse-dry process. Preferably, the mainframe transfer robot 242 provides independent robot motion along the X-Y-Z axes by the robot arm 2402 and independent substrate flipping rotation by the flipper robot end effector 2404.

The rapid thermal anneal (RTA) chamber 211 is preferably connected to the loading station 210, and substrates are transferred into and out of the RTA chamber 211 by the loading station transfer robot 228. The electroplating system preferably includes two RtA chambers 211 disposed on opposing sides of the loading station 210, corresponding to the symmetric design of the loading station 210. Thermal anneal process chambers are generally well known in the art, and rapid thermal anneal chambers are typically utilized in substrate processing systems to enhance the properties of the deposited materials. A variety of thermal anneal chamber designs may be used, including hot plate designs and heat lamp designs, to enhance the electroplating results by recrystallization of the deposited films, such as copper films, which can cause the flow of the deposited material to fill voids formed in features, purify layers of contaminants, such as oxygen, encourage diffusion of dopants, such as phosphorus, in the deposited materials, and manage crystal growth and orientation to control film properties. One particular thermal anneal chamber useful for the invention is the WxZ™ chamber available from Applied Materials, Inc., located in Santa Clara, Calif.

Referring again to FIGS. 1 and 2, the electroplating system platform 200 includes a control system 222 that controls the functions of each component of the platform. Preferably, the control system 222 is mounted above the mainframe 214 and includes a programmable microprocessor. The programmable microprocessor is typically programmed using a software designed specifically for controlling all components of the electroplating system platform 200. The control system 222 also provides electrical power to the components of the system and includes a control panel 223 that allows an operator to monitor and operate the electroplating system platform 200. The control panel 223 is a stand-alone module that is connected to the control system 222 through a cable and provides easy access to an operator. Generally, the control system 222 coordinates the operations of the loading station 210, the RTA chamber 211, the SRD station 212, the mainframe 214 and the processing stations 218. Additionally, the control system 222 coordinates with the controller of the electrolyte replenishing system 220 to provide the electrolyte for the electroplating process.

Figure 3:
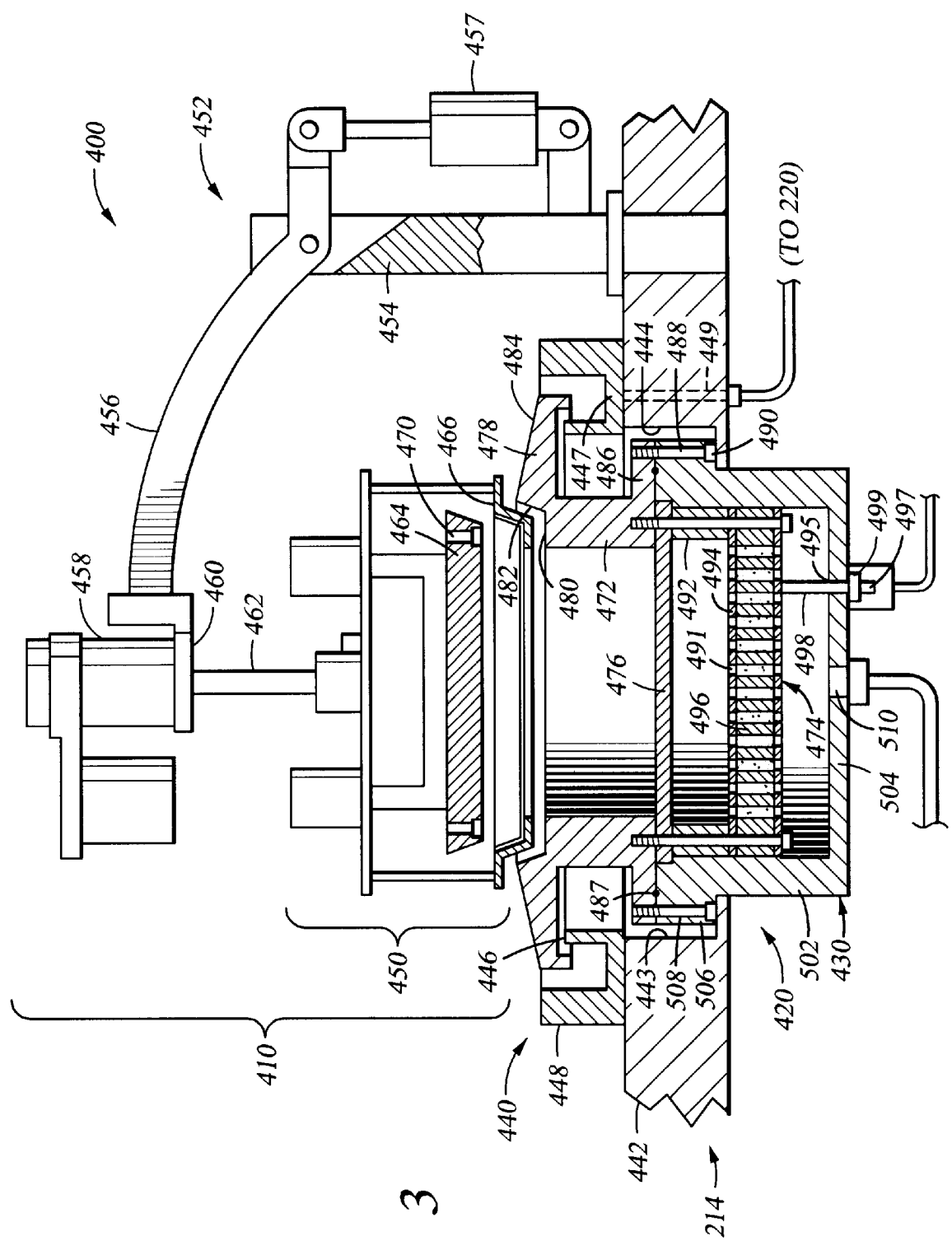
FIG. 3 is a cross sectional schematic view of a cell for electroplating a metal onto conductive semiconductor substrates.

FIG. 3 is a cross sectional view of one embodiment of an electroplating cell suitable for use with the processes of the invention. The invention also contemplates the use of other electroplating cells, not shown in FIG. 3, which may also be suitable for carrying out the processes of the invention. FIG. 3 illustrates an electroplating process cell 400 having one embodiment of a phosphorus doped anode used in depositing phosphorus doped films. The processing cell 400 generally includes a head assembly 410, a process kit 420, and an electrolyte collector 440. The head assembly 410 generally includes a substrate holder assembly 450 and a substrate assembly actuator 458, where the substrate holder assembly 450 is positioned above the process kit 420. The process kit 420 generally includes a bowl 430, a container body 472, an phosphorus doped anode assembly 474 and a filter 476. In the embodiment shown in FIG. 3, the anode assembly includes anode 496, which will be described below in greater detail.

As described above, one embodiment of the invention relates to apparatus for depositing metal layers which have an anode of a phosphorus doped metal. It has been discovered that the use of a phosphorus doped metal with the anode provides results that are unexpected and surprising. For example, when operating a plating cell incorporating other types of anodes, oxygen and oxygen bubbles can evolve on the anode during the electroplating process and may form oxide films thereon. Oxide formation on the anodes will result in anodes with less than desirable conductive properties, thereby detrimentally affecting the electroplating deposition process. Additionally, bubbles formed from free oxygen that reach the substrate plating surface may cause plating defects and prevent adequate electrolyte contact with the plating surface. It is contemplated that certain aspects of embodiments of the invention limit the detrimental effects of oxygen on the anodes by using an anode doped with phosphorus, e.g., the phosphorus doped anode 496 of the phosphorus doped anode assembly 474. The phosphorus in the phosphorus doped anode strongly reacts with the free oxygen formed at the surfaces of the anode thereby minimizing the formation of oxygen bubbles which may interfere with deposition. Further, the phosphorus may act as an aggressive deoxidant, reducing the free oxygen which can react with the anode which prevents the formation of bubbles and metal oxide films on the anode, thereby reducing or eliminating the potential for anode oxidation. Preferably, the amount of the phosphorus or other oxidant dopant is an amount that is effective and sufficient to provide the benefits of the invention.

Referring to FIG. 3, the phosphorus doped anode assembly 474 is preferably disposed below the container body 472 and attached to a lower portion of the container body 472, and the filter 476 is disposed between the phosphorus doped anode assembly 474 and the container body 472. Preferably, the filter 476 is attached to and completely covers the lower opening of the container body 472, and the phosphorus doped anode assembly 474 is disposed below the filter 476. A spacer 492 may be disposed between the filter 476 and the phosphorus doped anode assembly 474. Preferably, the filter 476, the spacer 492, and the phosphorus doped anode assembly 474 are fastened to a lower surface of the container body 472 using removable fasteners, such as screws and/or bolts. Alternatively, the filter 476, the spacer 492, and the phosphorus doped anode assembly 474 are removably secured to the bowl 430. The filter 476 preferably includes a ceramic diffuser that also serves to control the electrolyte flow pattern toward the substrate plating surface. The phosphorus doped anode assembly 474 preferably includes a consumable phosphorus doped anode 496 that serves as a metal source in the electrolyte.

As shown in FIG. 3, the phosphorus doped anode assembly 474 is a self-enclosed module having an anode enclosure 494 preferably porous and preferably made of the same metal as the metal to be electroplated, such as copper, to contain a consumable phosphorus doped anode 496 disposed therein. The consumable anode 496 used in the deposition of phosphorus doped copper layers preferably includes copper with a phosphorus dopant amount at about 0.01% to about 15% by weight of the anode. The physical structure or design of the enclosure itself can be conventional, and such enclosures are known in the art. The consumable anode 496 may include metal particles or metal wires, but preferably includes a perforated or a solid metal sheet, such as high purity copper, encased in the anode enclosure 494. Alternatively, the anode enclosure 494 is made of a porous material, such as a ceramic or a polymeric membrane. The anode enclosure 494 also acts as a filter that keeps the particulates generated by the dissolving metal within the anode enclosure 494.

The consumable (i.e., soluble) anode 496 provides substantially gas generation-free electrolyte into the solution in contrast to electroplating processes using insoluble anode where gas generation and bubble generation are particular problems that can detrimentally affect the electroplating process. The consumable anode also minimizes the need to constantly replenish the copper electrolyte as copper is introduced into the electrolyte by decomposition of the anode. In a preferred embodiment, the perforated metal plate, encased in or confined within the anode enclosure 494, includes a plurality of longitudinally disposed passages 491 therein, where the shape offers high surface area for dissolution of the anode 496 in the electrolyte solution as well as a passage for the electrolyte solution flow therethrough. The high surface area of the perforated metal plate minimizes anode polarization and oxidative side reactions, including oxygen co-evolution, and leads to a moderate current density for copper plating during the substrate anodic dissolution stage of the periodic reverse plating cycle. If it is desirable to have a smaller surface area exposed to the electrolyte due to excess additive decomposition on the anode, it may be desirable to cover the downward facing side (facing towards the flow) of the perforated plate with an insulating material.

An anode electrode contact 498 is preferably inserted through the anode enclosure 494 to provide electrical connection to the consumable anode 496 from a power supply. Preferably, the anode electrode contact 498 is made from a conductive material that is insoluble in the electrolyte, such as titanium, platinum and platinum-coated stainless steel. The anode electrode contact 498 preferably extends through the bowl 430 and is connected to an electrical power supply. Preferably, the anode electrical contact 498 includes a threaded portion 497 for a fastener nut 499 to secure the anode electrical contact 498 to the bowl 430, and a seal 495, such as a elastomer washer, is disposed between the fastener nut 499 and the bowl 430 to prevent leaks from the process kit 420.

The container body 472 of the process kit 420 is preferably a cylindrical body comprised of an electrically insulative material, such as ceramic, plastic, Plexiglas® (acrylic), Lexane®, PVC, CPVC, and PVDF. Alternatively, the container body 472 can be made from a metal, such as stainless steel, nickel and titanium, which is coated with an insulating layer, such as Teflon®, PVDF, plastic, rubber and other combinations of materials that do not dissolve in the electrolyte and can be electrically insulated from the electrodes (i.e., the phosphorus doped anode and the cathode of the electroplating system). The container body 472 is preferably sized and adapted to conform to the substrate plating surface and the shape of a substrate being processed through the system, typically circular or rectangular in shape. One preferred embodiment of the container body 472 includes a cylindrical ceramic tube having an inner diameter that has about the same dimension as or slightly larger than the substrate diameter.

An upper portion of the container body 472 extends radially outwardly to form an annular weir 478. The weir 478 extends over the inner wall 446 of the electrolyte collector 440 and allows the electrolyte to flow into the electrolyte collector 440. The upper surface of the weir 478 preferably matches the lower surface of the cathode contact ring 466. Preferably, the upper surface of the weir 478 includes an inner annular flat portion 480, a middle inclined portion 482 and an outer declined portion 484. When a substrate is positioned in the processing position, the substrate plating surface is positioned above the cylindrical opening of the container body 472, and a gap for electrolyte flow is formed between the lower surface of the cathode contact ring 466 and the upper surface of the weir 478. The lower surface of the cathode contact ring 466 is disposed above the inner flat portion 480 and the middle inclined portion of the weir 478. The outer declined portion 484 is sloped downwardly to facilitate flow of the electrolyte into the electrolyte collector 440.

A lower portion of the container body 472 extends radially outwardly to form a lower annular flange 486 for securing the container body 472 to the bowl 430. The outer dimension (i.e., circumference) of the annular flange 486 is smaller than the dimensions of the opening 444 and the inner circumference of the electrolyte collector 440 to allow removal and replacement of the process kit 420 from the electroplating process cell 400. Preferably, a plurality of bolts 488 are fixedly disposed on the annular flange 486 and extend downwardly through matching bolt holes on the bowl 430. A plurality of removable fastener nuts 490 secure the process kit 420 onto the bowl 430. A seal 487, such as an elastomer O-ring, is disposed between container body 472 and the bowl 430 radially inwardly from the bolts 488 to prevent leaks from the process kit 420. The nuts/bolts combination facilitates fast and easy removal and replacement of the components of the process kit 420 during maintenance.

The bowl 430 generally includes a cylindrical portion 502 and a bottom portion 504. An upper annular flange 506 extends radially outwardly from the top of the cylindrical portion 502. The upper annular flange 506 includes a plurality of holes 508 that match the number of bolts 488 from the lower annular flange 486 of the container body 472. To secure the upper annular flange 506 of the bowl 430 and the lower annular flange 486 of the container body 472, the bolts 488 are inserted through the holes 508, and the fastener nuts 490 are fastened onto the bolts 488. Preferably, the outer dimension (i.e., circumference) of the upper annular flange 506 is about the same as the outer dimension (i.e., circumference) of the lower annular flange 486. Preferably, the lower surface of the upper annular flange 506 of the bowl 430 rests on a support flange of the mainframe 214 when the process kit 420 is positioned on the mainframe 214.

The inner circumference of the cylindrical portion 502 accommodates the phosphorus doped anode assembly 474 and the filter 476. Preferably, the outer dimensions of the filter 476 and the phosphorus doped anode assembly 474 are slightly smaller than the inner dimension of the cylindrical portion 502 to force a substantial portion of the electrolyte to flow through the phosphorus doped anode assembly 474 first before flowing through the filter 476. The bottom portion 504 of the bowl 430 includes an electrolyte inlet 510 that connects to an electrolyte supply line from the electrolyte replenishing system 220. Preferably, the phosphorus doped anode assembly 474 is disposed about a middle portion of the cylindrical portion 502 of the bowl 430 to provide a gap for electrolyte flow between the phosphorus doped anode assembly 474 and the electrolyte inlet 510 on the bottom portion 504.

The electrolyte inlet 510 and the electrolyte supply line are preferably connected by a releasable connector that facilitates easy removal and replacement of the process kit 420. When the process kit 420 needs maintenance, the electrolyte is drained from the process kit 420, and the electrolyte flow in the electrolyte supply line is discontinued and drained. The connector for the electrolyte supply line is released from the electrolyte inlet 510, and the electrical connection to the phosphorus doped anode assembly 474 is also disconnected. The head assembly 410 is raised or rotated to provide clearance for removal of the process kit 420. The process kit 420 is then removed from the mainframe 214, and a new or reconditioned process kit is replaced into the mainframe 214.

Alternatively, the bowl 430 can be secured onto the support flange of the mainframe 214, and the container body 472 along with the phosphorus doped anode 496 and the filter are removed for maintenance. In this case, the nuts securing the phosphorus doped anode assembly 474 and the container body 472 to the bowl 430 are removed to facilitate removal of the phosphorus doped anode assembly 474 and the container body 472. New or reconditioned phosphorus doped anode assembly 474 and container body 472 are then replaced into the mainframe 214 and secured to the bowl 430.

Referring again to FIG. 3, preferably, the electrolyte collector 440 is secured onto the, body 442 of the mainframe 214 (as shown in FIG. 1 and 2) over an opening 443 that defines the location for placement of the process kit 420. The electrolyte collector 440 includes an inner wall 446, an outer wall 448 and a bottom 447 connecting the walls. An electrolyte outlet 449 is disposed through the bottom 447 of the electrolyte collector 440 and connected to the electrolyte replenishing system 220 (shown in FIGS. 1 and 2) through tubes, hoses, pipes or other fluid transfer connectors.

The head assembly 410 is mounted onto a head assembly frame 452. The head assembly frame 452 includes a mounting post 454 and a cantilever arm 456. The mounting post 454 is mounted onto the body 442 of the mainframe 214, and the cantilever arm 456 extends laterally from an upper portion of the mounting post 454. Preferably, the mounting post 454 provides rotational movement with respect to a vertical axis along the mounting post to allow rotation of the head assembly 410. The head assembly 410 is attached to a mounting plate 460 disposed at the distal end of the cantilever arm 456. The lower end of the cantilever arm 456 is connected to a cantilever arm actuator 457, such as a pneumatic cylinder, mounted on the mounting post 454. The cantilever arm actuator 457 provides pivotal movement of the cantilever arm 456 with respect to the joint between the cantilever arm 456 and the mounting post 454. When the cantilever arm actuator 457 is retracted, the cantilever arm 456 moves the head assembly 410 away from the process kit 420 to provide the spacing required to remove and/or replace the process kit 420 from the electroplating process cell 400. When the cantilever arm actuator 457 is extended, the cantilever arm 456 moves the head assembly 410 toward the process kit 420 to position the substrate in the head assembly 410 in a processing position.

The head assembly 410 generally includes a substrate holder assembly 450 and a substrate assembly actuator 458. The substrate assembly actuator 458 is mounted onto the mounting plate 460, and includes a head assembly shaft 462 extending downwardly through the mounting plate 460. The lower end of the head assembly shaft 462 is connected to the substrate holder assembly 450 to position the substrate holder assembly 450 in a processing position and in a substrate loading position.

The substrate holder assembly 450 generally includes a substrate holder 464 and a cathode contact ring 466. The exposed surfaces of the cathode contact ring, except the surfaces of the contact pads that come in contact with the substrate, are preferably treated to provide hydrophilic surfaces or coated with a material that exhibits hydrophilic properties, such as a hydrophilic surface treatment is available from Millipore Corporation, located in Bedford, Mass. The hydrophilic surface significantly reduces beading of the electrolyte on the surfaces of the cathode contact ring. Other contact ring designs are useful in the electroplating processing cell according to the invention, such as the contact ring designs described in U.S. patent application Ser. No. 09/201, 486 entitled "Cathode Contact Ring For Electrochemical Deposition", filed on Nov. 30, 1998, which is incorporated herein by reference. A substrate holder 464 is preferably positioned above the cathode contact ring 466 and includes a bladder assembly 470 that provides pressure to the backside of a substrate and ensures electrical contact between the substrate plating surface and the cathode contact ring 466.

Phosphorus Doped Film Deposition Processes

In one embodiment, the invention relates to the formation of a substrate feature using a conductive metal film doped with phosphorus. To form a phosphorus doped conductive metal film, a phosphorus containing or doped layer, preferably a seed layer, is first deposited on a conductive substrate, with the amount of doping in the layer between about 0.01% and about 15% by weight (wt. %) of phosphorus, preferably between about 0.01 wt. % and about 3 wt. %, and most preferably between about 0.01 wt. % and about 0.05 wt. %. A conductive metal layer preferably of the same material as the doped layer, such as copper for a phosphorus doped copper layer, is then deposited on the phosphorus doped layer. The phosphorus doped layer and the conductive metal layer are preferably deposited by an electroplating deposition process.

A "seed layer" is broadly defined herein as continuously or discontinuously deposited material used to encourage growth of subsequently deposited films on a substrate surface and to enhance interlayer adhesion of deposited films. While the detailed description contained herein applies to the use of phosphorus as a doping material, other doping materials which may also be deoxidants, such as boron, indium, tin, beryllium, and combinations thereof, are also contemplated by the invention. Additionally, while the following description applies to the use of copper as the preferred conductive material, other conductive materials, such as tungsten, aluminum, and nickel, preferably those materials that can be deposited by electrochemical deposition, are also contemplated by the invention.

The term "electroplating" refers to the deposition of a layer of metal, such as copper or aluminum, on a substrate by passing an electric current between an anode and a cathode. Preferably, with this invention, the electroplating involves passing a current between a phosphorus doped anode, and a cathode through an electrolytic solution and precipitating out a metal film. The cathode is usually the material being deposited upon, such as a substrate field or a deposited metal layer on a substrate surface, and includes a conductive material. For a consumable phosphorus doped anode, the phosphorus doped anode is generally composed of the material being deposited, such as copper, which dissolves in the electroplating solution at the phosphorus doped anode and precipitates at the cathode. For example, a seed layer of phosphorus doped copper may be deposited by a phosphorus doped anode by dissolving the anode in a electroplating solution and precipitating on a conductive substrate acting as the cathode; and then the phosphorus doped copper seed layer functions as a cathode for a subsequent electroplating process, such as depositing a copper layer on the phosphorus doped copper seed layer.

Preferably, for electroplating processes depositing a phosphorus doped seed layer, the phosphorus dopant is introduced by a soluble (consumable) phosphorus doped anode. The phosphorus doped anode is doped with phosphorus between about 0.01 wt. % and about 15 wt. %, preferably between about 0.01 wt. % and about 3 wt. %, and more preferably between about 0.01 wt. % and about 0.05 wt. %. In addition to improving film characteristics, the phosphorus in the doped anode inhibits or prevents the release of particulate matter into electroplating solutions by forming a film on the anode that protects the anode material, for example, copper, from excessive dissolution in an acidic environment.

In another aspect of the invention, the phosphorus doped film may be used to advantage in processing a substrate. A substrate feature is preferably formed by depositing a dielectric layer and etching the feature in the dielectric layer and then forming a copper metallization stack by depositing a conductive layer, preferably a barrier or liner layer, in the feature, depositing a seed layer doped with phosphorus on the conductive layer, and then depositing a conductive metal layer on the seed layer doped with phosphorus. The term "feature" is broadly defined in accordance with its customary usage in the semi-conductor industry, and is more particularly defined herein as a substrate structure formed in the substrate material or materials deposited on the substrate, and includes, but is not limited to, such substrate structures as vias, contacts, interconnects, and dual damascenes.

Figure 4:
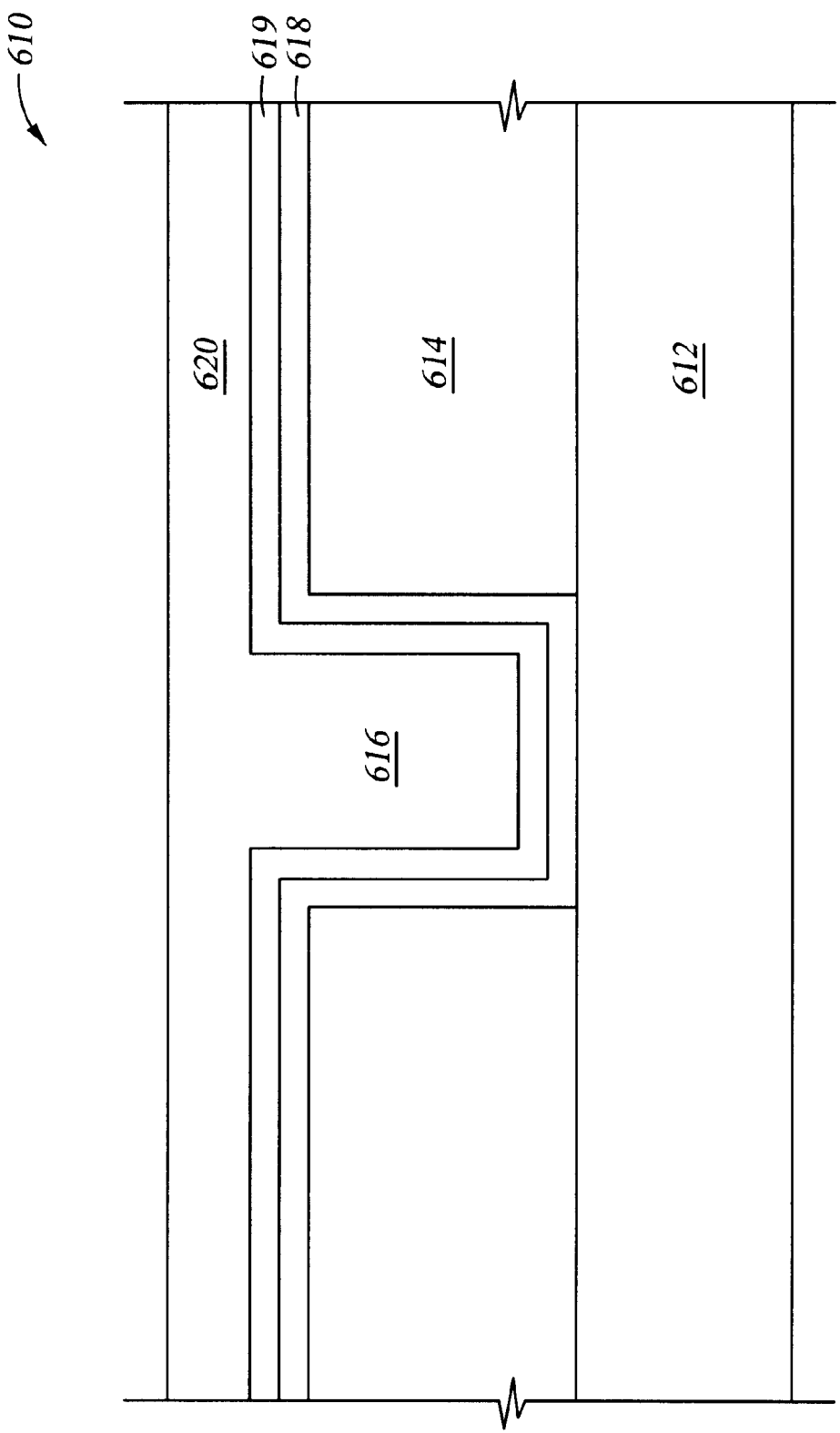
FIG. 4 is a cross sectional view of an interconnect in a dielectric layer illustrating a metallization technique for forming such interconnect in accordance with an embodiment of the invention.

FIG. 4 is a schematic cross-sectional view of a metallized film stack 610 of the invention having a liner or barrier layer 618 formed from a conductive material, a phosphorus doped seed layer 619, and a conductive metal layer 620 deposited in a feature 616 formed on a substrate 612. The term "substrate" is broadly defined herein as the underlying material in a deposition process, such as a silicon wafer, another dielectric layer, or a metal layer, and can include a series of underlying layers of various materials, with the preferred underlying materials include barrier materials, conductive metals, and doped silicon. For metallization schemes where the conductive liner or barrier layer 618 is not integrated into the scheme, a conductive substrate or conductive substrate surface is used. A pre-treating process for the seed layer 619, such as a flash layer, may be deposited on the surface to be plated to provide a conductive surface for an applied current used to deposit subsequent metal layers by electroplating techniques.

Referring to FIG. 4, the feature 616 is formed by depositing and pattern etching a dielectric layer 614 on the conductive substrate 612 to form the desired aspect of the feature 616, such as a via, contact, trench or line. The conductive substrate 612 may take the form of a doped silicon substrate or it may be a first or subsequent electrically conductive layer formed on a substrate. The dielectric layer 614 can be a pre-metal dielectric layer deposited over a silicon wafer or an inter-level dielectric layer, and is formed over the underlying conductive substrate 612 in accordance with procedures conventionally known in the art. Once the dielectric layer 614 is deposited, the dielectric layer 614 can be etched with any dielectric etching or patterning process known in the art, including plasma etching. Any dielectric material, whether presently known or yet to be discovered, may be used and is within the scope of the invention.

The liner or barrier layer 618 is preferably deposited prior to the phosphorus doped seed layer 619 and a conductive metal layer 620 to prevent or inhibit diffusion from the metal layers 619 and 620 to the underlying substrate 612. For copper metal layers or doped copper metal layers, a preferred liner or barrier layer 618 includes refractory metals and nitrides of refractory metals (such as tungsten (W), tungsten nitride ($WN_x$), niobium (Nb), aluminum silicates, etc.), tantalum (Ta), tantalum nitride (TaN), titanium nitride (TiN), PVD Ti/$N_2$-stuffed, doped silicon, aluminum, and aluminum oxides, ternary compounds (such as TiSiN, titanium silicon nitride, WSiN, tungsten silicon nitride, etc.), or a combination of these layers. The most preferred liner or barrier materials are tantalum (Ta) and tantalum nitride (TaN), which may be deposited individually or sequentially, for copper metallization schemes.

The liner or barrier 618 layer can be deposited by any known appropriate process known in the art, but is preferably deposited using a PVD-IMP process, especially for high aspect ratio features, and can also be deposited by other methods such as chemical vapor deposition (CVD) technique, including by the decomposition of organometallic precursors, or by other PVD techniques such as collimated or long throw PVD sputtering. Organometallic precursor decomposition deposition is also a preferred deposition technique since CVD processes provide for more conformal deposition of a film. Collimated PVD sputtering is well known in the art, and generally is performed by placing a collimator between the target and the substrate which acts as a filter to allow only sputtered material traveling in a certain direction through the collimator, generally normal to the substrate surface. Long throw PVD sputtering, also well known in the art, generally is performed by increasing a spacing from the target to the substrate. The extended distance increases the probability that the sputtered material reaching the substrate is directed normal to the substrate surface.

The phosphorus doped seed layer 619 is deposited over the TaN liner or barrier layer 618, using an electrochemical process, preferably an electroplating process utilizing a phosphorus doped anode. The phosphorus doped seed layer 619 includes a conductive material, such as copper, and a phosphorus doping material. For instance, a phosphorus doped copper material can be deposited over the liner or barrier layer 618 as a seed layer for a subsequently deposited conductive copper layer 620 which can fill the feature. The phosphorus reduces or eliminates the copper agglomeration in the deposition process that heretofore existed to produce more uniform layers providing improved seed characteristics. The phosphorus also minimizes the oxidation of metal films at the interface of the conductive material and the electroplating solution to produce more uniform films. The phosphorus doped copper seed layer 619 contains a phosphorus concentration of between about 0.01 wt. % and about 15% wt. %, but preferably between about 0.01 wt. % and about 3 wt. %, and most preferably between about 0.01 wt. % and about 0.05 wt. %.

A layer of conductive metal 620, preferably copper, is deposited on the phosphorus doped seed layer 619, where the layer of deposited copper 620 completely fills the interconnect 616. In order to fill the interconnect 616, it will generally require that the entire field of the structure will be covered with copper. The copper layer 620 can be deposited by PVD, IMP, CVD, electroplating, electroless deposition, evaporation, or any other known methods in the art, but the copper layer 620 is preferably deposited by electroplating techniques. An exemplary electroplating chemistry for depositing a copper film in a system containing a soluble anode is described in co-pending U.S. application Ser. No. 09/245,780, filed on Feb. 5, 1999, entitled, "Electrodeposition Chemistry For Improved Filling Of Apertures", and is incorporated herein by reference to the extent not inconsistent with this invention.

The feature may be further processed by planarizing the top portion of the metallized film stack 610, preferably by chemical mechanical polishing (CMP). During the planarization process, portions of the copper layer 618 and the dielectric layer 614 are removed from the top of the structure leaving a fully planar surface with a conductive feature formed in the via 616 therein. Other subsequent processing can include annealing if desired, additional deposition of layers, etching, and other processes known to IC manufacturing. In certain aspects, the invention relates to the formation of substrate features using a phosphorus doped film as detailed above. Copper films deposited by other electroplating methods tend to be unevenly formed and may agglomerate. In accordance with this invention, it is contemplated that the addition of certain other doping agents to the film can promote the deposition of even-thickness films and reduce the formation of deposition defects from film agglomeration. For thin seed layers, it is contemplated that phosphorus tends to reduce the agglomeration of the film and provide a more uniform and continuous seed layer. In particular, it is contemplated that phosphorus improves the deposition of the conductive metal layers by reducing the surface diffusivity, or surface tension, one of the main causes of agglomeration, as the conductive material is deposited. Therefore, less agglomeration occurs with the doped conductive layer, and the conductive layer is deposited more conformally with less voids. It is further contemplated that since the phosphorus dopant material is also a deoxidizing agent to conductive materials, such as copper, oxidation which can create a particle problem in the electroplating process and which may also contribute to film agglomeration by forming oxides on the surface of the substrate can be greatly reduced.

Some deposition processes, such as electroplating, can be affected by the integrity of an underlying seed layer. Therefore, doped underlying layers that are deposited more conformally with a more even layer thickness and less agglomeration can provide a more uniform subsequent metal layer deposited thereon. The subsequent layer uniformity improves the adhesion between the layers and further results in less void formations and discontinuities in the electroplated film. Additionally, it is contemplated that dopants in the seed layer lower the surface tension of the film, thereby lowering the surface mobility of the conductive metal film which results in film hardening. As the hardness of the film increases, the film's resistance to electromigration increases as atoms have more difficulty moving through the metal film in response to the high current density applied to the film, which allows the formation of films with improved electromigration properties.

The phosphorus dopants of the invention have other benefits, for example, it is contemplated that phosphorus dopants control grain growth in the deposited electroplated films. Phosphorus dopants in the copper films promote smaller grain sizes by interfering with the crystal orientation of copper nucleation sites in the deposited film. With smaller grain sizes, the film has improved mobility of atoms within the grains and a corresponding lower melting temperature allowing faster recrystallization of copper films in post-deposition treatments such as annealing and other processes used to improve the properties of deposited electroplated films. The smaller grains sizes also reduce agglomeration and promote layer evenness.

While foregoing is directed to the one or more embodiments of the invention, other and further embodiments of the invention may be devised without departing from the basic scope thereof, and the scope thereof is determined by the claims that follow including their equivalents.

What is claimed is:

1. An apparatus for the deposition of a metal layer in an electrochemical deposition process, comprising:

an enclosure providing for flow of an electrolyte therethrough, a phosphorus doped metal disposed in the enclosure, and an electrode disposed through the enclosure and in electrical connection with the phosphorus doped metal, wherein the phosphorus doped metal comprises a consumable anode plate, and the consumable anode plate comprises a plurality of longitudinally disposed passages therein.

2. The apparatus of claim 1, wherein the phosphorus doped metal comprises phosphorus doped copper.

3. The apparatus of claim 1, wherein the phosphorus doped metal comprises between about 0.01% and about 15% by weight of phosphorus to prevent particle agglomeration.

4. An apparatus, comprising:

an electrochemical deposition chamber for depositing a metal onto a substrate having a conductive substrate plating surface, comprising:

a) a substrate holder adapted to hold the substrate in a position wherein the conductive substrate plating surface is exposed to an electrolyte in an electrolyte container;

b) a cathode electrically contacting the conductive substrate plating surface;

c) an electrolyte container having an electrolyte inlet, an electrolyte outlet and an opening adapted to receive the conductive substrate plating surface; and d) a phosphorus doped anode electrically connected to the electrolyte, wherein the phosphorus doped anode comprises a consumable anode plate, and the consumable anode plate comprises a plurality of longitudinally disposed passages therein.

5. The apparatus of claim 4, wherein the phosphorus doped anode further comprises:

i) an enclosure providing for flow of an electrolyte therethrough;

ii) the phosphorus doped anode being disposed in the enclosure; and iii) an electrode disposed through the enclosure and in electrical connection with the phosphorus doped anode.

6. The apparatus of claim 4, wherein the phosphorus doped anode comprises phosphorus doped copper.

7. The apparatus of claim 6, wherein the phosphorus comprises between about 0.01% and about 15% by weight of the anode to prevent particle agglomeration.

* * * * *